April 10, 1962 C. E. MARSHALL 3,029,352
TRANSISTORIZED COUNTER DECADE
Filed Oct. 24, 1957
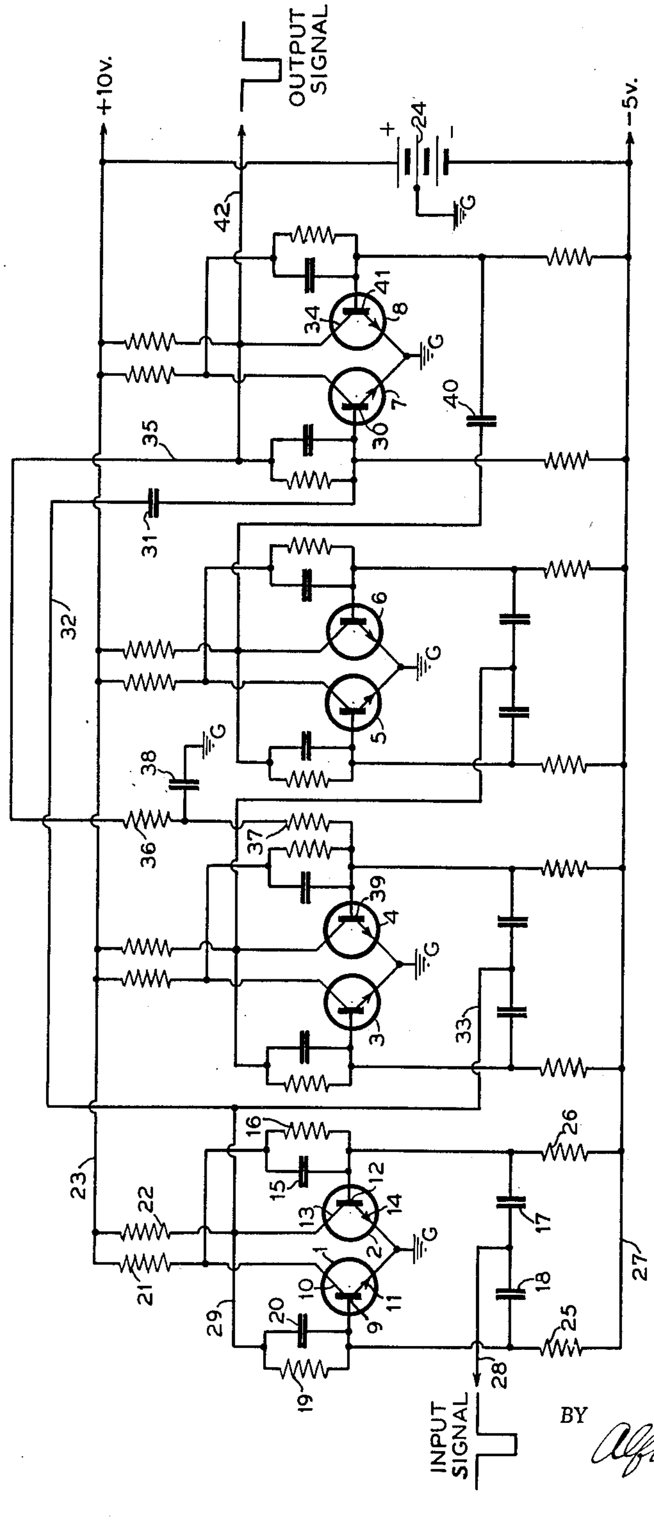
INVENTOR.
CHARLES E. MARSHALL
BY *Alfred W. Barber*
ATTORNEY United States Patent Office 3,029,352

Patented Apr. 10, 1962

3,029,352

TRANSISTORIZED COUNTER DECADE

Charles E. Marshall, Port Washington, N.Y., assignor to Potter Instrument Co., Inc., Plainview, N.Y., a corporation of New York Filed Oct. 24, 1957, Ser. No. 692,232
1 Claim. (Cl. 307—88.5)

The present invention concerns electronic counters and, in particular, transistorized counter decades and the like.

In U.S. Patent Number 2,538,122 entitled, "Counter," issued to John T. Potter on Jan. 16, 1951 an electronic counter is shown and described utilizing vacuum tubes. The basic counter element is a series of four binary pairs modified to count to 10 instead of 16 as would four unmodified pairs in series. The modification consists in two added circuit paths which operate when the counter has reached a count of 9 to cause all four binary pairs to reset to zero. This is accomplished when the counter has a count of 9 with the first and fourth stages "on" so that the next input pulse turns the fourth pair off through one branch circuit and prevents the second pair from going on through another branch circuit. It has been found according to the present invention that with transistors substituted for the tubes in this circuit that certain improvements in inherent reliability and simplification are obtainable. It has also been found according to the present invention that the diodes usually associated with transistor binary counters can be eliminated providing a very considerable reduction in the cost of the counter.

Accordingly one object of the present invention is to provide methods of and means for making more reliable the operation of binary counters modified to count according to the decimal system.

Another object is to provide a transistorized binary counter modified to count according to the decimal system.

A further object is to reduce the number of parts and cost of binary counters modified to the decimal system.

These and other objects will be apparent from the detailed description of the invention given in connection with the figure of the drawing.

In the drawing is shown a schematic of a preferred form of the present invention.

The FIGURE shows four transistor binary flip-flop stages connected in cascade with added circuits to convert to a count of ten to fill and return to the initial condition. Transistors 1 through 8 are connected in binary pairs essentially similar to the connections of 1 and 2. Transistor 1 includes base 9, collector 10 and emitter 11 while transistor 2 includes base 12, collector 13 and emitter 14. Collector bias is supplied from a suitable source such as battery 24 which is grounded to G at an intermediate point so that a predetermined positive bias is supplied over lead 23 and through resistors 21 and 22 to collectors 10 and 13 respectively. Emitters 11 and 14 are connected to ground G while the negative end of battery 24 supplies a predetermined bias over lead 27 and through resistors 25 and 26 to bases 9 and 12 respectively. Cross connections consist in resistor 16 shunted by capacitor 15 connected from base 12 to collector 10 and resistor 19 shunted by capacitor 20 connected between base 9 and collector 13. This circuit forms a symmetrical flip-flop circuit and is thus a circuit in which only one of the transistors can conduct at a time in a stable condition. It can also be made to flip from conduction by one of the transistors to conduction by the other of the transistors by the application of a short duration pulse of suitable rise-time to both bases simultaneously. This operation is well known in the art. The conducting transistor becomes non-conducting and the non-conducting transistor becomes conducting each time a pulse is applied. The actuating input pulse is conducted over lead 28 to the junction between capacitors 17 and 18 one of which is connected to base 9 and the other to base 12. Assume initially that transistor 2 is conducting so that a negative input pulse causes it to become non-conducting and transistor 1 to become conducting. Upon the next input pulse transistor 1 becomes non-conducting and transistor 2 becomes conducting. When transistor 2 conducts again the current flow to collector 13 causes a drop in its potential and this drop provides the negative pulse over leads 29 and 33 to trigger the stage made up of transistors 3 and 4. This drop in potential causing the trigger action of transistors 3 and 4 is a much sharper pulse than is the rise in potential caused when transistor 2 goes "off" due to the fact that while both pulses must modify the charge in capacitors at the end of lead 33, the drop in potential takes place through the low impedance between emitter 14 and collector 13 while the rise in potential is provided over a much higher resistance path through resistor 22. This difference in sharpness of the pulses provides a major contribution to the stage-by-stage triggering action. Thus for every two input pulses to transistors 1 and 2 a pulse is passed to transistors 3 and 4. The same process is repeated so that for every two pulses received by transistors 3 and 4 a pulse is passed to transistors 5 and 6. In this manner the first pair (1 and 2) flip at count 1, the second pair (3 and 4) flip at count 2, the third pair (5 and 6) flip at count 4 and the fourth pair (7 and 8) flip at count 8. In order to count by the decimal system a simple and effective circuit modification is made. The output of the third pair, i.e. transistor 6 is coupled to transistor 8 through capacitor 40 so that on the eighth input pulse transistor 8 becomes non-conducting and transistor 7 becomes conducting as in the usual sequence of events and establishing the normal condition in all pairs for a count of 8. With transistor 8 non-conducting the potential of its collector 34 is high and a positive pulse goes out over lead 35 through resistor 36 and across capacitor 38 providing a slight delaying action and through resistor 37 to base 39 of transistor 4 thereby holding transistor 4 in its conducting condition even when an actuating input pulse is received over lead 33. This circuit holds the pair (second) consisting of transistors 3 and 4 unactuated as long as the pair (fourth) consisting of transistors 7 and 8 is actuated on "on." When the ninth input pulse is received over lead 28 the first pair or stage consisting of transistors 1 and 2 goes "on" or flips and since the fourth pair or stage consisting of transistors 7 and 8 is already on the normal condition for a count of nine is provided. When the tenth pulse is applied over lead 28 the first pair or stage turns "off" but the second pair or stage is prevented from going on by the above described circuit and furthermore a second auxiliary circuit is provided by means of lead 32 and capacitor 31 from collector 13 to base 30 of transistor 7 which turns it off returning the fourth pair or stage to its "off" or initial condition. Thus on the tenth input pulse all pairs or stages are in their "off" or initial condition as at count zero.

Thus has been described a circuit which starts at zero and returns to zero at the tenth input pulse and thereby is adapted to count according to the decimal system. It may be noted also on the tenth input pulse that transistor 8 in becoming conducting provides a negative pulse at its collector 34 which may be utilized as an output pulse to another similar decade over lead 42.

While only one embodiment of the present invention has been shown and described it will be apparent to those skilled in the art that many modifications are possible within the spirit and scope of the invention as set forth in particular in the appended claim.

What is claimed is:

In an electronic counter decade comprising four transistor flip-flop stages serially connected to count in binary progression, the combination of, a passive direct current series resistive path with a time delay capacitative shunting path directly connected from the fourth of said stages to the second of said stages to hold said second stage "off" after an initial predetermined delay and for the duration of the "on" period of said fourth stage, and a transient responsive capacitative feed-forward circuit connected from the first of said stages to the fourth of said stages to turn said fourth stage "off" when said first stage goes "off" to return said decade to its initial condition upon the receipt of the tenth input pulse thereby converting the normal binary counting to decimal counting.

References Cited in the file of this patent

UNITED STATES PATENTS

| | | |
|---|---|---|
| 2,538,122 | Potter | Jan. 16, 1951 |
| 2,540,024 | Bergfors | Jan. 30, 1951 |
| 2,562,591 | Wagner | July 31, 1951 |
| 2,566,918 | Bergfors | Sept. 4, 1951 |
| 2,584,811 | Phelps | Feb. 5, 1952 |
| 2,671,171 | Rench | Mar. 2, 1954 |
| 2,929,929 | Kroupa | Mar. 22, 1960 |

OTHER REFERENCES

Krenitsby: Decade Counter Employs Silicon Transistors, Electronics (August 1955), (pps. 112 to 113).